US011841818B2

(12) United States Patent
Voss et al.

(10) Patent No.: US 11,841,818 B2
(45) Date of Patent: Dec. 12, 2023

(54) BUS-COMPATIBLE SENSOR ELEMENT AND COMMUNICATION SYSTEM

(71) Applicant: TE Connectivity Sensors Germany GmbH, Dortmund (DE)

(72) Inventors: Andreas Voss, Dortmund (DE); Oliver Borges, Senden (DE); Axel Bartos, Waltrop (DE)

(73) Assignee: TE Connectivity Sensors Germany GmbH, Dortmund (DE)

( * ) Notice: Subject to any disclaimer, the term of this patent is extended or adjusted under 35 U.S.C. 154(b) by 626 days.

(21) Appl. No.: 16/841,042

(22) Filed: Apr. 6, 2020

(65) Prior Publication Data
US 2020/0327090 A1    Oct. 15, 2020

(30) Foreign Application Priority Data

Apr. 9, 2019 (DE) .......................... 102019205058.1

(51) Int. Cl.
*G06F 13/42* (2006.01)
*G01D 5/14* (2006.01)
(Continued)

(52) U.S. Cl.
CPC ......... *G06F 13/4256* (2013.01); *G01D 5/147* (2013.01); *G01R 33/0023* (2013.01); *G01R 33/07* (2013.01); *G01R 33/09* (2013.01)

(58) Field of Classification Search
CPC .. G06F 13/4256; G06F 13/4291; G06F 13/20; G06F 13/22; G06F 13/225; G06F 13/24; G06F 13/26; G06F 13/28; G06F 13/282; G06F 13/285; G06F 13/287; G06F 13/30; G06F 13/32; G06F 13/34; G06F 13/36; G06F 13/362; G06F 13/3625; G06F 13/364; G06F 13/366; G06F 13/368; G06F 13/37; G06F 13/372; G06F 13/374; G06F 13/376; G06F 13/378; G06F 13/38; G06F 13/382; G06F 13/385; G06F 13/387;
(Continued)

(56) References Cited

U.S. PATENT DOCUMENTS

| 10,055,376 | B1* | 8/2018 | Newkirk ............. G06F 13/4291 |
| 2012/0072628 | A1 | 3/2012 | Crockett et al. |
| 2019/0012291 | A1 | 1/2019 | Biniguer |

FOREIGN PATENT DOCUMENTS

| DE | 102009058755 A1 | 6/2011 |
| DE | 102016011709 A1 | 3/2018 |
| WO | WO-2018060149 A1 * | 4/2018 ........... G01D 11/245 |

OTHER PUBLICATIONS

Extended European Search Report, European Application No. 20168060. 0-1224, European Filing Date, Jul. 27, 2020.

* cited by examiner

*Primary Examiner* — Lee E Rodak
(74) *Attorney, Agent, or Firm* — Barley Snyder

(57) ABSTRACT

A bus-compatible sensor element includes a converter generating a digital measurement signal, a first data input receiving an input data, a first data output for outputting an output data, a first clock input receiving a first clock signal, a slave select connection receiving an activation signal, and a 1-bit shift register. The 1-bit shift register includes a shift register data input, a shift register output, and a second clock input. The shift register output is connected to the slave select connection to activate the sensor element in response to the activation signal present at the shift register data input.

20 Claims, 7 Drawing Sheets

(51) Int. Cl.
*G01R 33/00* (2006.01)
*G01R 33/07* (2006.01)
*G01R 33/09* (2006.01)

(58) Field of Classification Search
CPC .. G06F 13/40; G06F 13/4004; G06F 13/4009; G06F 13/4013; G06F 13/4018; G06F 13/4022; G06F 13/4027; G06F 13/4031; G06F 13/4036; G06F 13/404; G06F 13/4045; G06F 13/405; G06F 13/4054; G06F 13/4059; G06F 13/4063; G06F 13/4068; G06F 13/4072; G06F 13/4077; G06F 13/4081; G06F 13/4086; G06F 13/409; G06F 13/4095; G06F 13/42; G06F 13/4204; G06F 13/4208; G06F 13/4213; G06F 13/4217; G06F 13/4221; G06F 13/423; G06F 13/4234; G06F 13/4239; G06F 13/4243; G06F 13/4247; G06F 13/4252; G06F 13/426; G06F 13/4265; G06F 13/4269; G06F 13/4273; G06F 13/4278; G06F 13/4282; G06F 13/4286; G06F 13/4295; G01D 5/147; G01R 33/0023; G01R 33/07; G01R 33/09; G01B 7/02; G01B 7/003; G08C 15/06

See application file for complete search history.

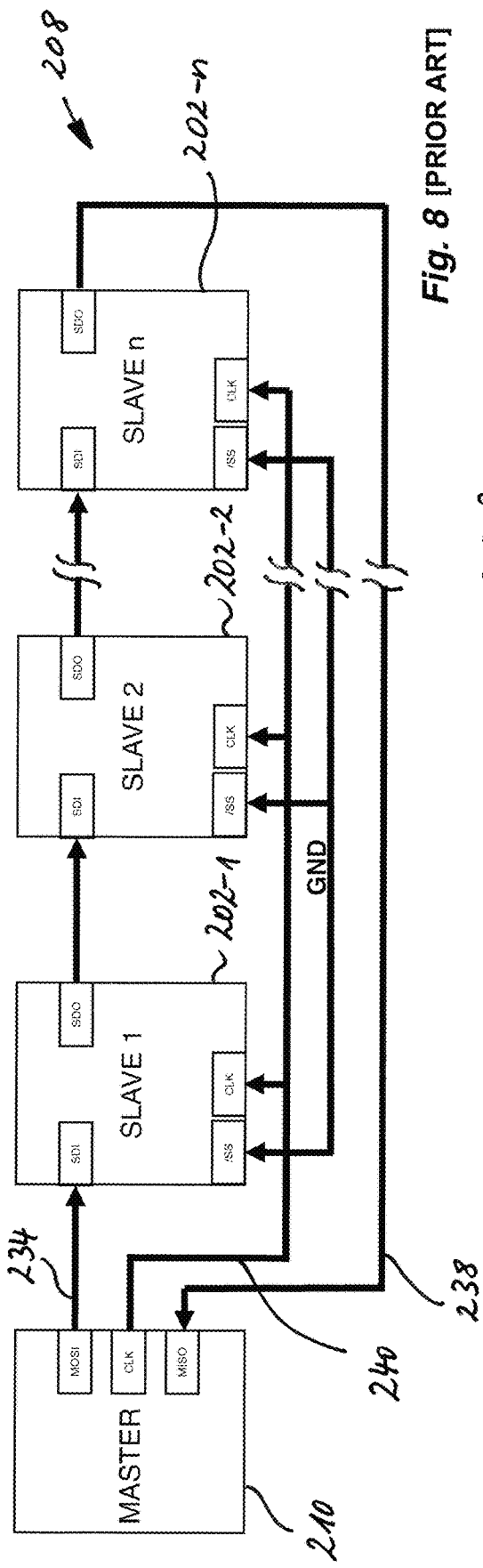
Fig. 8 [PRIOR ART]
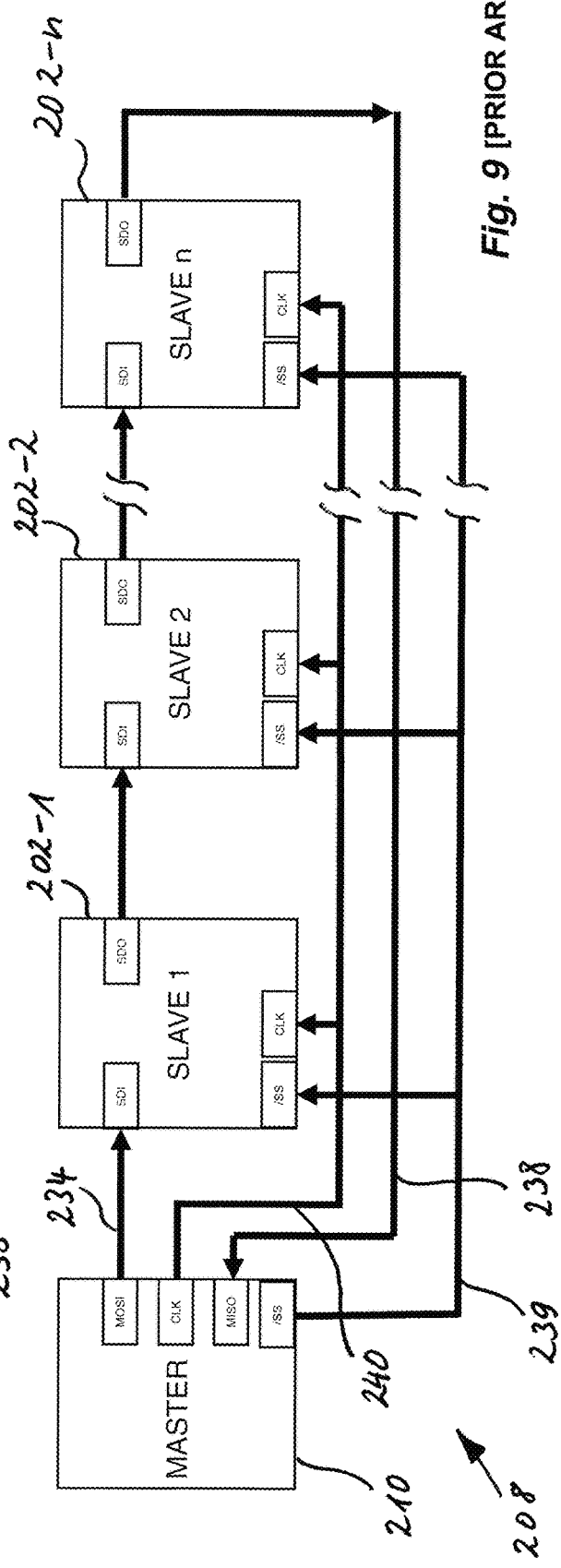
Fig. 9 [PRIOR ART]

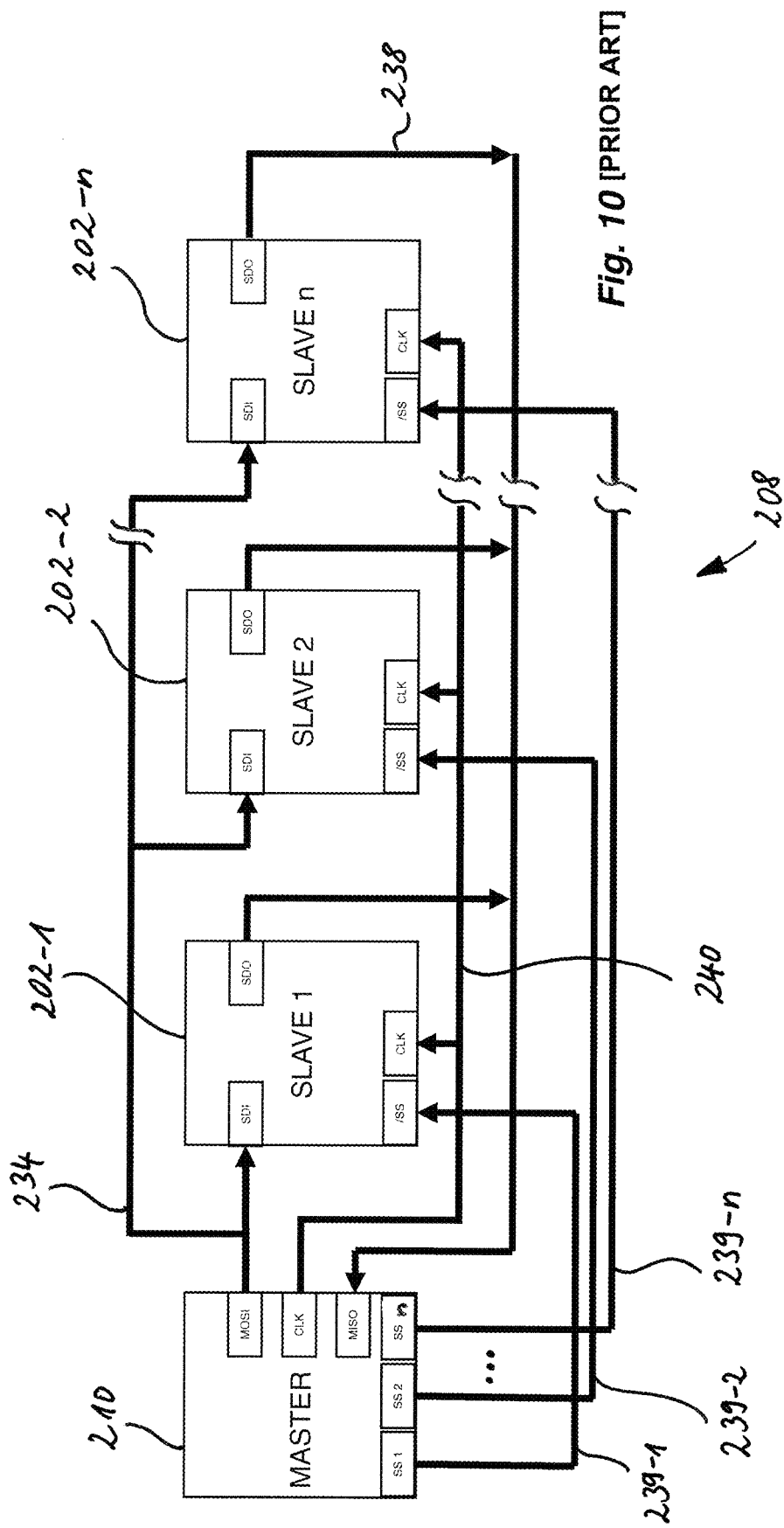
Fig. 10 [PRIOR ART]

BUS-COMPATIBLE SENSOR ELEMENT AND COMMUNICATION SYSTEM

CROSS-REFERENCE TO RELATED APPLICATION

This application claims the benefit of the filing date under 35 U.S.C. § 119(a)-(d) of German Patent Application No. 102019205058.1, filed on Apr. 9, 2019.

FIELD OF THE INVENTION

The present invention relates to a sensor element and, more particularly, to a bus-compatible sensor element.

BACKGROUND

The measurement of linear movements is used, for example, for controlling machine tools, in pneumatics, in automation technology and robotics, as well as in the automotive sector. A contactless detection of movements offers, among other things, the advantage of freedom from wear. Among the contactless measurement methods, the optical and magnetic measurement methods are the most common. While the optical methods ensure a very high level of accuracy due to the small wavelength of the light, magnetic methods are far less sensitive to contamination and damage, in particular, because magnets and sensor components may be completely encapsulated in a non-magnetic hermetic sleeve.

Various manufacturers offer displacement sensor systems, in which the position of a displaceable permanent magnet is ascertained, for example, with the aid of a magnetoresistive (MR) sensor or of a two-dimensional or three-dimensional Hall sensor. In this case, longer distances are detectable as a result of the movement of the magnet (which is also referred to below as the magnetic field source) being detected by a plurality of magnetic sensor elements.

Different applications require that an application-specific and often very long path length is to be covered by the displacement sensor. In order to provide such sensor arrangements, the use of communication bus systems is suitable for connecting the magnetic sensor elements. The concept of the Serial Peripheral Interface (SPI) is suitable, for example, for such a connection of magnetic sensor elements.

Positioning systems, for example, are often equipped with a magnet in the moving part of the applications. With a magnetoresistive sensor system suitably arranged for this purpose, it is possible to deduce the position of the magnet and thus the placement of the positioning system. Typical representatives of such positioning systems are pneumatic or hydraulic cylinders, the position of which must be checked and regulated, for example, within automatic positioning sequences. Additional fields of application of this sensor system are the detection of fill levels by fill level sensors having float bodies, which contain a signal magnet, or also sensors for controlling brake pedals, where they may represent a direct replacement of the previously used PLCD technology (PLCD=permanent magnetic linear contactless displacement). For many applications, it is necessary to use scalable hardware in order to be able to respond cost-effectively to the corresponding requirements of the application environment. A basic requirement of the corresponding sensor system is scalability to different measurements, which in the best case scenario results in a modular design of the position sensor in order to be able to adapt the sensor system to the customer's requirements. A sensor approach, which is based on a bus structure of many serially-arranged sensors must, however, have in part a very long return line from the last sensor element.

FIGS. 8 and 9 show by way of example a known serial SPI bus structure ("daisy chain") in which a master 210 activates a plurality of sensors 202-1, 202-2, . . . , 202-$n$ ("slave 1" to "slave n"). The data sent by the master 210 are transmitted on a data line 234 serially from the master 210 through each sensor 202 to the last sensor 202-$n$. A data return line 238 leads from the last sensor (slave n) 202-$n$ back to the master 210. In addition, the clock 240 is transmitted in parallel to each individual sensor module 202. Each of the sensors 202-1, 202-2, . . . , 202-$n$ includes an activation input /SS, via which the respective sensor may be activated. In the arrangement shown in FIG. 8, all activation inputs /SS are connected to ground potential, so that all sensors 202-1, 202-2, . . . , 202-$n$ are always active. Alternatively, as shown in FIG. 9, it may be provided that an activation line 239 activates or deactivates all sensors 202-1, 202-2, . . . , 202-$n$ at a predetermined point in time.

However, the architecture shown in FIGS. 8 and 9 has the disadvantage that the information runtime also increases with increasing length of the sensor chain, because the pieces of information (data) must be clocked through all sensors 202-1, 202-2, . . . , 202-$n$. There is also the problem that the return line 238 from the last sensor element 202-$n$ may potentially be very long. Considerable interference is to be expected, especially in the automobile and industrial environment, so that such a return line 238 represents a sensitive point in the sensor structure. For example, the return line 238 causes electromagnetic interference, signal echoes and unacceptable latencies.

Alternatively, it is known to provide a parallel architecture, as shown in FIG. 10. The master 210 again controls a plurality of sensors 202-1, 202-2, . . . , 202-$n$ ("slave 1" to "slave n"). The data sent by the master 210 are transmitted serially on a data line 234 from the master 210 in parallel to each sensor 202-1, 202-2, . . . , 202-$n$. A data return line 238 leads from the last sensor (slave n) 202-$n$ back to the master 210. In addition, the clock 240 is transmitted in parallel to each individual sensor module 202. Each of the sensors 202-1, 202-2, . . . , 202-$n$ includes an activation input /SS, via which the respective sensor may be activated. In order to activate the individual sensors 202-1, 202-2, . . . , 202-$n$ in a targeted manner, the master 210 has separate activation outputs SS1 to SSn, which are connected to the associated inputs /SS of sensors 202-1, 202-2, . . . , 202-$n$, in each case by a separate line 239-1, 239-2, . . . , 239-$n$.

However, the architecture shown in FIG. 10 has the disadvantage that, on the one hand, it must be known and defined for each application how many slaves are in the chain. On the other hand, the possible number of outputs on the master 210 and of activation lines 239-1, 239-2, . . . , 239-$n$ in practice limits the possible number of sensors connected in series.

SUMMARY

A bus-compatible sensor element includes a converter generating a digital measurement signal, a first data input receiving an input data, a first data output for outputting an output data, a first clock input receiving a first clock signal, a slave select connection receiving an activation signal, and a 1-bit shift register. The 1-bit shift register includes a shift register data input, a shift register output, and a second clock input. The shift register output is connected to the slave select connection to activate the sensor element in response to the activation signal present at the shift register data input.

BRIEF DESCRIPTION OF THE DRAWINGS

The invention will now be described by way of example with reference to the accompanying Figures, of which:

FIG. 8 is a block diagram of a series connection of sensor elements according to the prior art;

FIG. 9 is a block diagram of another series connection of sensor elements according to the prior art; and FIG. 10 is a block diagram of a parallel connection of sensor elements according to the prior art.

DETAILED DESCRIPTION OF THE EMBODIMENT(S)

Hereinafter, the invention is described in greater detail by way of example using exemplary embodiments with reference to the attached figures. In the figures, elements which correspond to one another in structure and/or function are provided with the same reference symbols. Several features or combinations of features from the embodiments shown and described may also represent independent inventive solutions or solutions in accordance with the invention.

A magnetoelectric displacement sensor 100 according to the invention is explained in greater detail below with reference to the figures, and in particular initially with reference to FIG. 1. It is clear to a person skilled in the art, however, that the invention is not restricted to magnetoelectric sensors or to displacement sensors, and that the principles of the present invention may also be applied to arbitrary other types of sensor systems. Furthermore, the individual bus-compatible sensor elements need not be of the same type. It is sufficient that each sensor element includes a communication interface and a shift register according to the present invention.

Figure 1:
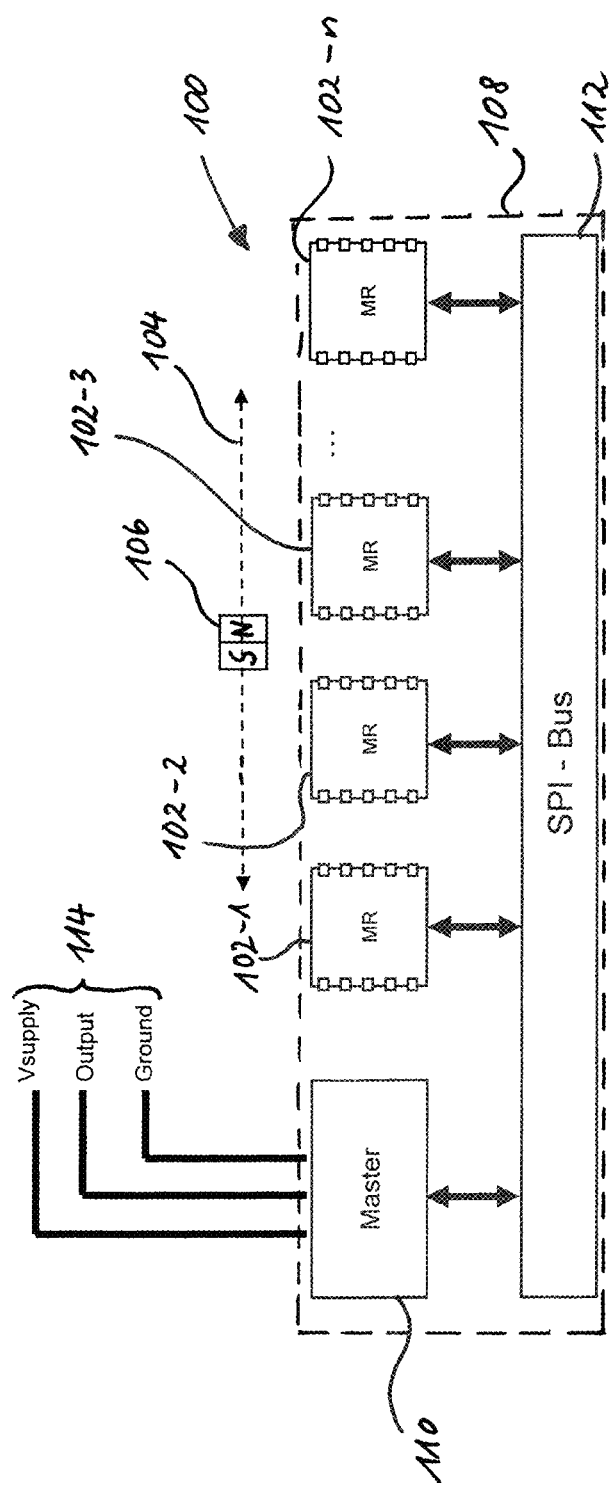
FIG. 1 is a block diagram of a magnetoelectric displacement sensor according to an embodiment.

A magnetoelectric displacement sensor 100, as shown in FIG. 1, has a plurality n magnetoresistive (MR) sensors 102-1, 102-2, . . . , 102-n, which are situated along a displacement path 104 of a permanent magnet 106 and which form magnetic field sensor elements of a magnetic field sensor unit 108. The proximity or absence of the permanent magnet 106 changes the magnetic field, which is detected by each of the magnetic field sensor elements 102-1, 102-2, . . . , 102-n. As depicted schematically in FIG. 1, the magnetic field sensor elements 102-1, 102-2, . . . , 102-n communicate with a control unit 110, the master, via a serial peripheral interface (SPI) bus 112. Each of the magnetic field sensor elements 102-1, 102-2, . . . , 102-n may also be referred to as a bus-compatible sensor element 102.

The control unit 110 is connected to a higher-level controller via an output connection 114. On the one hand, the higher-level controller uses the position information output by the master 110 and, on the other hand, provides the required supply voltage Vsupply and the reference potential (ground).

Figure 2:
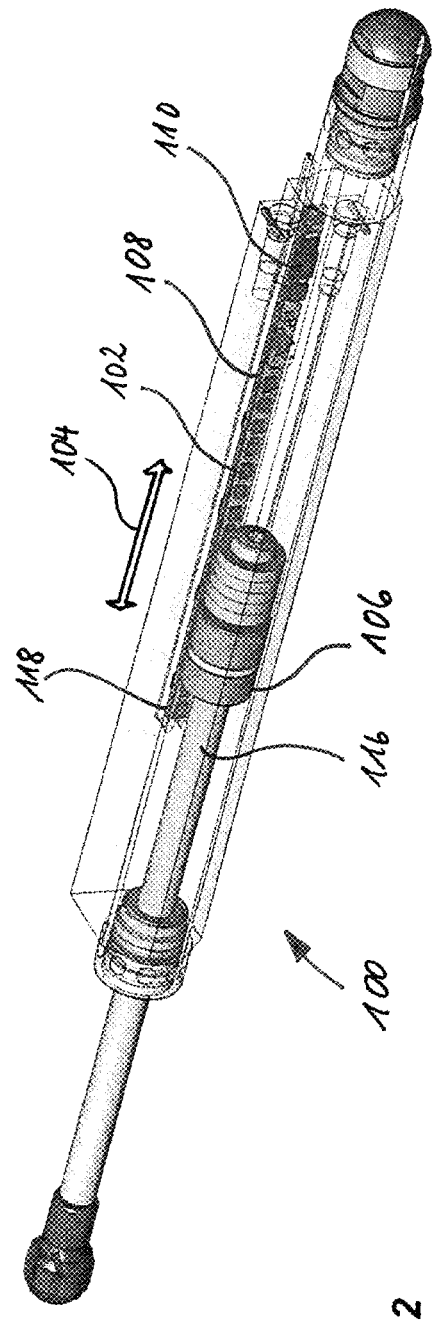
FIG. 2 is a perspective view of a hydraulic cylinder including a magnetoelectric displacement sensor.

FIG. 2 shows a magnetoelectric displacement sensor 100 in an exemplary embodiment in which the displacement path of a piston 116 is measured. A permanent magnet 106 is connected to the piston 116. A magnetic material of the permanent magnet 106 may be embedded in an aluminum cylinder, for example. A magnetic field sensor unit 108 is situated along the displacement path 104 of the piston 116. The displacement path 104 may be straight or curved. The magnetic field sensor unit 108 shown here includes, for example, sixteen MR magnetic field sensor elements 102, which are situated on a common circuit carrier 118. With these sixteen magnetic field sensor elements 102, for example, it is possible to cover a deflection of the piston by 110 mm. A control unit 110, which functions as a master, is also situated on the circuit carrier 118. Connection elements are also provided, which are routed to the outside and enable the position signal to be read out.

Each of the magnetic field sensor elements 102, in addition to the magnetic field probes, also includes the analog/digital conversion as well as the interfaces and connecting lines required to form a serial SPI bus. With such a modular arrangement, it is possible to monitor many different cylinder lengths and geometries using a single sensor product family, the total length of the magnetic field sensor unit 108 being easily adaptable. A simple two-layer PCB is sufficient to connect the magnetic field sensor elements 102 and the control unit 110 to one another. Other suitable circuit carriers, such as flexible printed circuit boards, may, of course, also be used.

Figure 3:
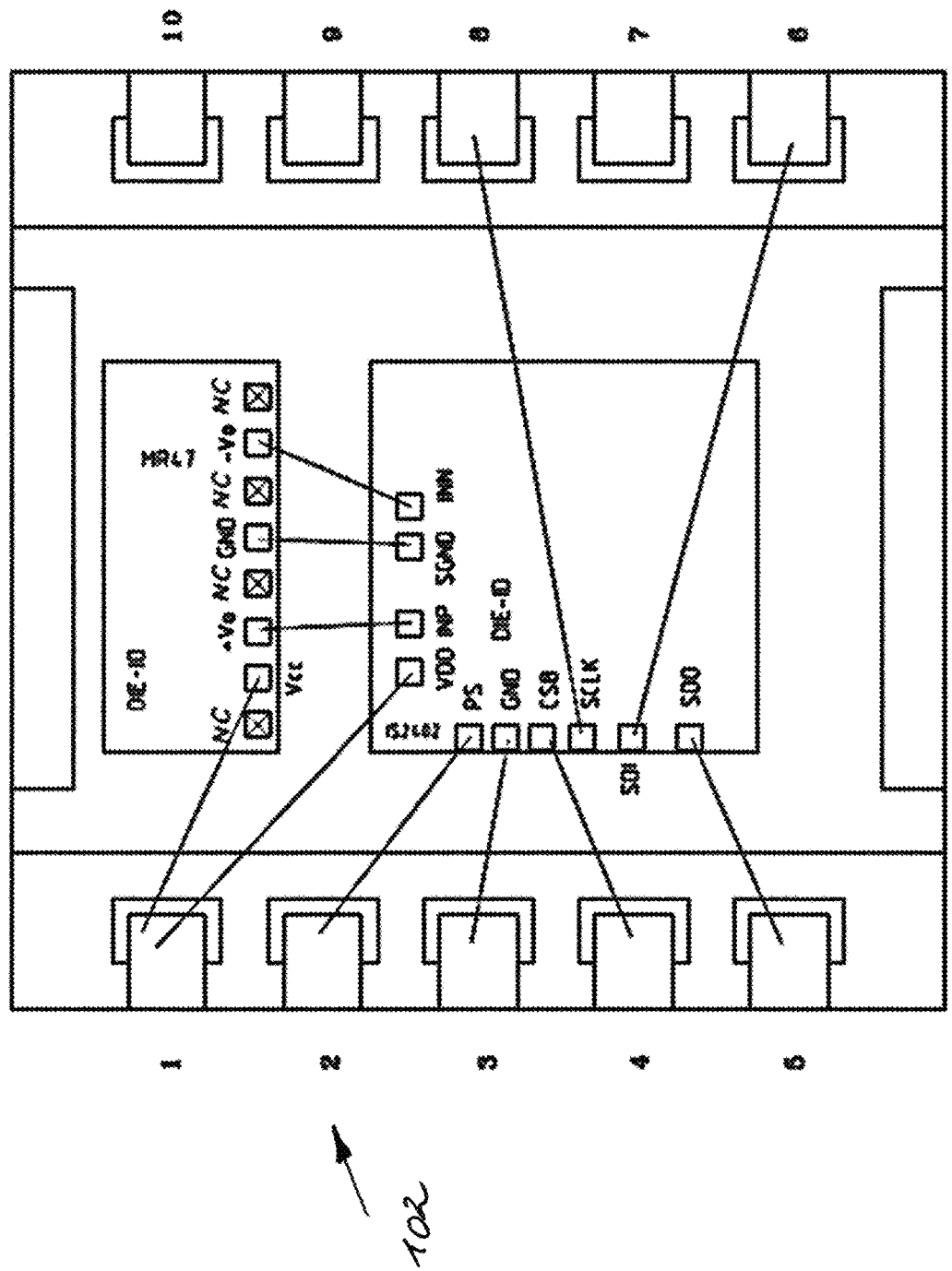
FIG. 3 is a schematic diagram of a magnetic field sensor element.

A magnetic field sensor element 102 according to an embodiment is shown in FIG. 3. The basic function of the magnetic field sensor elements 102 is the conversion of the measured magnetic field vector into an electrical voltage, which is processed for further signal processing via digitization and with the aid of suitable algorithms. The anisotropic magnetoresistive effect (AMR) occurs in ferromagnetic materials, whose specific resistance changes with the angle between the direction of the magnetic field and the direction of the current. The change in resistance is a few percent and useful even with weak magnetic fields. With the TMR (Tunnel Magneto Resistive) effect, the tunnel resistance between two ferromagnetic layers changes as a function of the angle of the magnetization of the two layers. The Giant Magneto Resistive (GMR) effect was only discovered in 1988. The electrical resistance of two thin ferromagnetic layers, separated by a thin non-magnetic layer, changes as a function of the angle of magnetization in the two ferromagnetic layers to each other and provides resistance changes of up to 50%. The electrical resistance is highest with an anti-parallel magnetization. The change in resistance is not a function of the current direction. The characteristic curves of GMR sensors are determined by their design by stacking several layers having different properties and magnetizations. This allows the characteristic curves to be specifically adapted to the requirements of a specific measurement application.

Various types of magnetic field sensors 102 may be used in the process. In an embodiment, the magnetic field sensor element 102 is a magnetic angle sensor having sine and cosine signal outputs. Another embodiment relates to a magnetic switching sensor having defined voltage levels at dedicated magnetic field strengths. Another embodiment is a magnetic field strength sensor which, with its specific characteristic curve, provides a description of the measured magnetic field vector component (or a plurality in the x, y and z dimensions).

Figure 4:
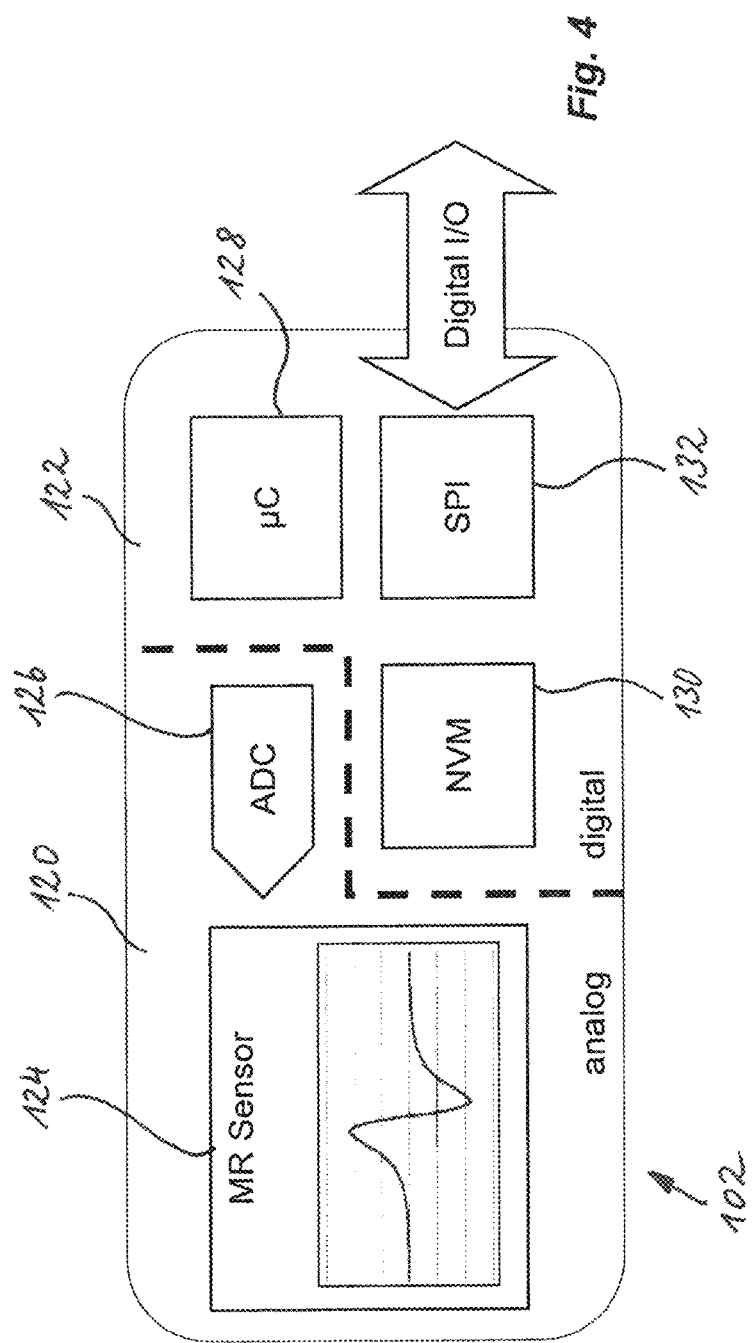
FIG. 4 is a block diagram of the magnetic field sensor element.

The magnetic field sensor element 102 is shown in a block diagram in FIG. 4. The magnetic field sensor element 102 is divided into an analog domain 120 and a digital domain 122. The analog domain 120 has a magnetic field probe 124, which in the present case is designed by way of example as a magnetoresistive magnetic field probe 124 or MR sensor 124. The magnetoresistive magnetic field probe 124 detects a magnetic flux density of a magnetic field of the magnet 106 and generates an analog electrical output signal as a function of the magnetic field. The magnetoresistive magnetic field probe 124, in another embodiment, is a two- or three-dimensional Hall sensor.

An analog/digital converter 126 converts the output signal of the magnetic field probe 124 into a digital measurement signal. The magnetic field sensor element 102 has a microcontroller 128 controlling all functions and a non-volatile memory (NVM) 130.

The individual address of the magnetic field sensor element 102, for example, may be stored in the memory 130. This can be done at the factory or later during initial operation. The signal processing may also provide self-test routines, offset and temperature compensation, and the possibility of calibration. For this purpose, calibration data, for example, may be stored in the memory 130.

The magnetic field sensor element 102 further includes an SPI bus interface 132, as shown in FIG. 4. The individual magnetic field sensor element 102 is connected to the other magnetic field sensor elements and to the master via the interface 132.

With the arrangement shown in FIG. 4, the analog part 120 may be completely encapsulated and is therefore particularly immune to interference and protected against electrostatic discharge. With the integrated SPI interface 132, it possible to efficiently arrange a plurality of magnetic field sensor elements 102 in series and using a particularly simple circuit carrier layout.

Figure 5:
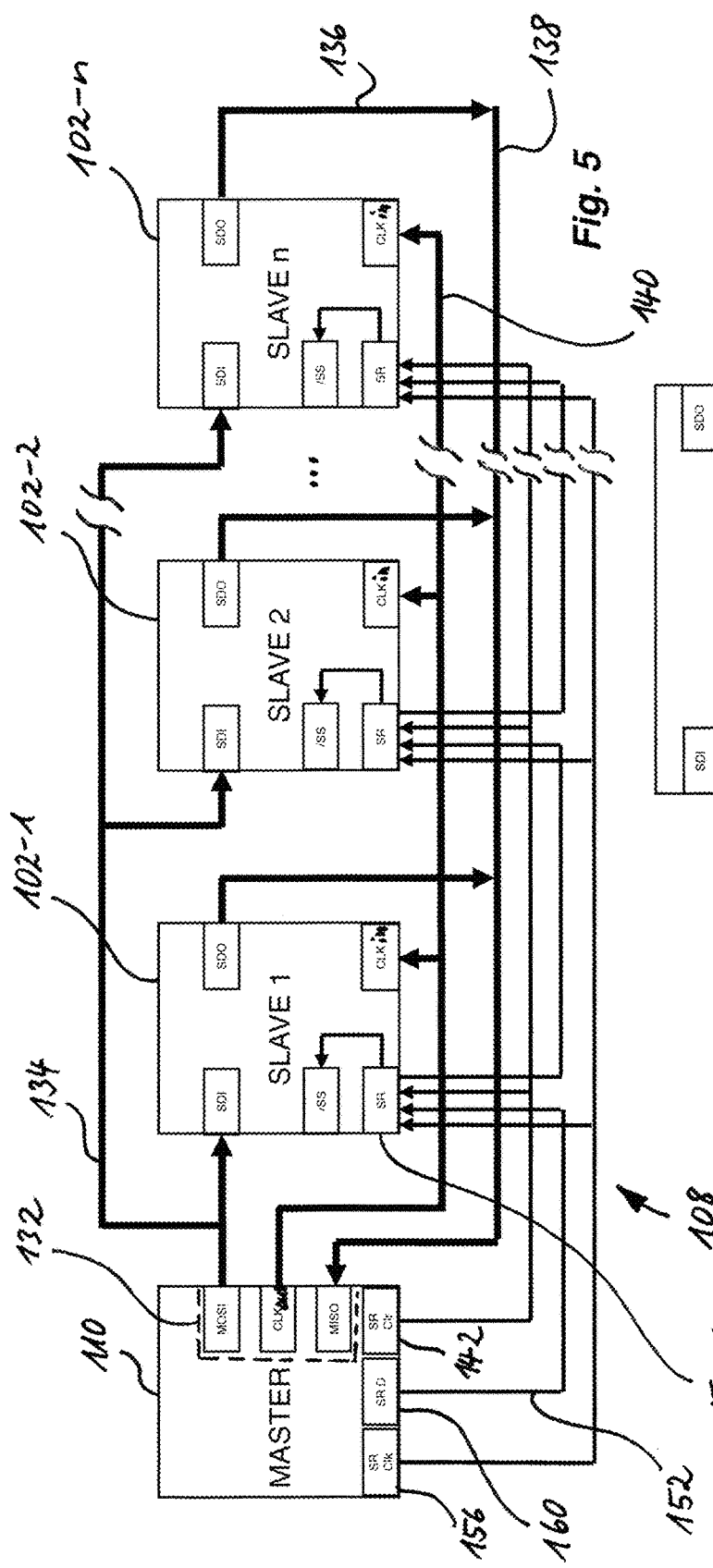
FIG. 5 is a block diagram of a communication system according to an embodiment.

A cascading of a plurality n sensor elements, for example, magnetic field sensor elements, 102-1, 102-2, . . . , 102-n and of a master 110 for forming a communication system, in particular, a magnetic field sensor unit 108 using an SPI communication protocol, is shown in FIG. 5. As shown in detail in FIG. 6, each of the magnetic field sensor elements 102-1, 102-2, . . . , 102-n has a parallel data input SDI and a parallel data output SDO. Each data input SDI is connected in parallel to the data output MOSI of the master 110. The data outputs SDO of the sensor elements 102-1, 102-2, . . . , 102-n are also connected in parallel to the data input MISO of the master 110. Each magnetic field sensor element 102-1, 102-2, . . . , 102-n has a clock input CLKin, which is connected to a clock output CLKout of the master 110. The actual data communication thus corresponds to the architecture shown in FIG. 10.

In contrast to the known sensor elements, however, each sensor element 102 according to the present invention includes a 1-bit shift register 150. As is apparent from the overview of FIGS. 5 and 6, the master 110 has a shift register clock output 156 which is connected in parallel to the shift register clock inputs 158 of the sensor elements 102-1, 102-2, . . . , 102-n. Furthermore, the master 110 includes an activation pulse output 160, which is connected to the data input SR D of the shift register 150-1 of the sensor element 102-1 closest to the master 110. As soon as a pulse is present at the data input SR D of the shift register 150-1, it is shifted on to the data output SR Q of the shift register 150-1 with the next clock, which is output at the shift register clock output 156. According to the invention, the data output SR Q of each shift register 150 is connected internally to an activation connection 162. This is the slave select connection /SS, with which a sensor element 102 is activated for communication via the SPI protocol.

The output SR Q of the first sensor element to 102-1 is connected to the data input SR D of the next sensor element 102-2. The activation pulse is therefore simultaneously present at the data input of the next shift register 150-2. With the next shift register clock SR Clk, the activation pulse is applied to the activation connection 162-2 of the second sensor element 102-3 and in addition further pushed to the data input of the next sensor element 102-n. For example, if a single activation pulse is output at the beginning of addressing, which is then followed by a sequence of zeros, this pulse activates the nth sensor element 102-n after n+1 shift register clocks, while all n−1 sensor elements in front of it and all sensor elements number n+1 to n+m (n and m are natural numbers), which may still be arranged thereafter, are inactive.

If the nth sensor element is a sensor element selected by master 110 with which communication is to take place, the master stops emitting a shift register clock signal after n+1 shift register clocks and now sends the data to be communicated via the data output MOSI. In this case, only the nth sensor element 102-n is active and processes the transmitted data. Furthermore, the selected nth sensor element 102-n may in turn send communication data (for example measurement data) to the data input MISO of the master 110.

With the bus structure shown in FIG. 5, it is possible, on the one hand, to loop an activation signal, which consists only of a sequence of individual bits, through the shift register 150 of each magnetic field sensor element 102-1, 102-2, . . . , 102-n, but at the same time to provide a parallel structure for the communication of more extensive data, by passing the communication signals without any time delay and without processing to all magnetic field sensor elements that are not addressed. The process is very fast, since in each case only a single bit must be shifted for addressing. In addition, each shift register 150 represents a type of signal amplifier, so that even with long chains no loss of quality is able to occur because the impulses distorted by the effects of interference on the channel may be regenerated again.

Multiple sensor elements 102-1, 102-2, . . . , 102-n may also be activated at the same time, if not only non-activating signals (for example, zeros) but additional activation pulses are output during the clocks after the first pulse that is to reach the selected sensor element furthest from the master 110. These additional pulses must be configured chronologically in such a way that they are present at the activation connections /SS of the additional selected sensor elements during the same clock at which the first pulse has reached the selected sensor element furthest away from the master 110 and the master 110 stops outputting shift register clocks 156.

For data communication, each magnetic field sensor element 102-1, 102-2, . . . , 102-n includes an internal communication interface, for example, a standard SPI interface 132. A data line 134, a clock line 140, and a data return line 138 shown in FIG. 5 are each connected to the MOSI, CLK and MISO connections of the SPI interface 132 of the master 110. According to the invention, the respectively addressed magnetic field sensor elements 102-1, 102-2, . . . , 102-n are addressed via the slave select signal. Only when a specific magnetic field sensor element 102-1, 102-2, . . . , 102-n is addressed, is the associated SPI interface 132 activated and taps the data line 134 and the clock line 140, or sends data to the data return line 138.

A reset input SR Clr is also provided on each sensor element 102-1, 102-2, . . . , 102-n, which is connected in parallel to the reset output 142 of the master 110. In this way, it is possible to reset all sensor elements 102-1, 102-2, . . . , 102-n simultaneously to a defined state.

Figure 6:
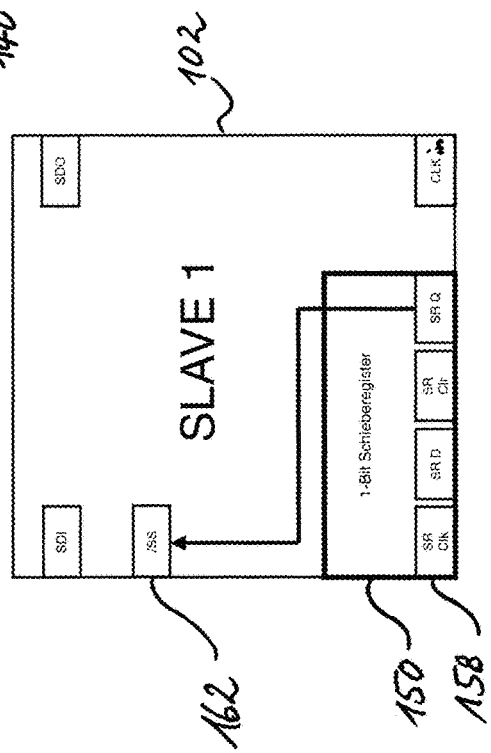
FIG. 6 is a block diagram of a bus-compatible sensor element of the communication system.

The magnetic field sensor elements 102-1, 102-2, . . . , 102-n shown in FIGS. 5 and 6 may be implemented in a particularly simple and cost-effective manner, since, for example, SPI interface modules are available as internal communication interfaces as standard components. The magnetic field sensor element 102-1, 102-2, . . . , 102-n may be cost-effectively manufactured, for example, as a user-specific integrated circuit (ASIC).

A line termination 136 is situated on the last magnetic field sensor element 102-n, as shown in FIG. 5, which connects the data output SDO via the data return line 138 to the return line data input MISO.

If the magnetic field sensor unit 108 is manufactured, in particular, as part of an endless belt from a roll, it may be provided that the connection between the first data line 134 and the data return line 138 is established by a removable plug connector or a crimp connector. The number of magnetic field sensor elements 120 required in each case may then be cut off and terminated by a corresponding end termination connector. The opposite side, however, may be connected to a separate control unit via another connector.

Figure 7:
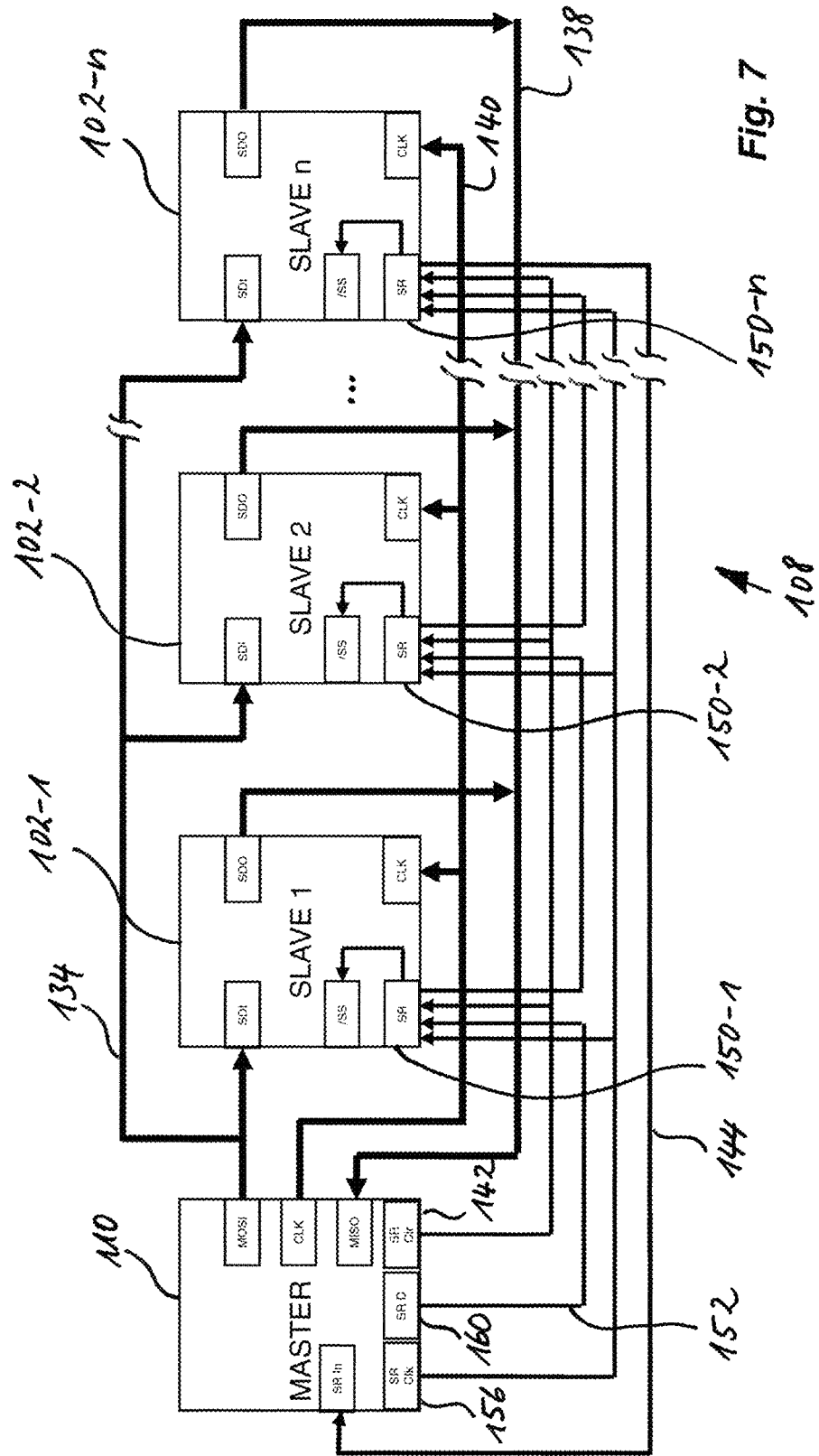
FIG. 7 is a block diagram of a communication system according to another embodiment.

Another embodiment of the communication architecture according to the invention is explained in detail below with reference to FIG. 7. The communication system 108 in the embodiment of FIG. 7 essentially corresponds to that shown in FIG. 5, with the difference that an additional shift register data return line 144 is provided. The shift register data return line 144 connects the data output SR Q of the last sensor element 102-n in the series to a shift register data input SR IN of the master 110. With the aid of this shift register data return line 144, it is possible that the master 110 detects after how many shift register clocks an emitted activation pulse arrives at the master 110 again. From this, the number n of bus participants designed as slaves may be derived.

In the present disclosure, a sensor element 102 is specified in which a standard SPI interface 132 is expanded by a 1-bit shift register 150 connected upstream from the slave select input /SS. The shift register 150 is controlled by connections routed separately from the component to the outside. SR Clk in this case refers to a clocked clock input, SR D to a data input, SR Clr to a clear input and SR Q to a data output, which is internally connected to the SS pin of the SPI interface.

A short information runtime may advantageously be ensured, because the sensor elements 102 are individually connected directly to the communication bus 112. The provision of chip select lines for each individual sensor 102 may be omitted, because the respective SS pin activations take place via the 1-bit shift register 150 daisy chain structure.

What is claimed is:

1. A bus-compatible sensor element, comprising:
   a converter generating a digital measurement signal;
   a first data input receiving an input data;
   a first data output for outputting an output data;
   a first clock input receiving a first clock signal;
   a slave select connection receiving an activation signal; and
   a 1-bit shift register including a shift register data input, a shift register output, and a second clock input receiving a second clock signal separate and independent from the first clock signal, the shift register output is connected to the slave select connection to activate the sensor element in response to the activation signal present at the shift register data input.

2. The bus-compatible sensor element of claim 1, wherein the 1-bit shift register includes a reset input for resetting the shift register output.

3. The bus-compatible sensor element of claim 1, further comprising a magnetic field probe detecting a magnetic flux density of a magnetic field and generating an analog electrical output signal as a function of the magnetic field.

4. The bus-compatible sensor element of claim 3, wherein the magnetic field probe is a magnetoresistive sensor or a two- or three-dimensional Hall sensor.

5. A communication system, comprising:
   a master including a first clock output and a second clock output separate and independent from the first clock output; and
   a bus-compatible sensor element including a converter generating a digital measurement signal, a first data input receiving an input data from the master, a first data output for outputting an output data, a first clock input connected to the first clock output and receiving a first clock signal from the master, a slave select connection receiving an activation signal, and a 1-bit shift register, the 1-bit shift register includes a shift register data input, a shift register output, and a second clock input connected to the second clock output and receiving a second clock signal from the master, the shift register output is connected to the slave select connection to activate the sensor element in response to the activation signal present at the shift register data input.

6. The communication system of claim 5, wherein the master includes a first master data output connected to the first data input and a master data input connected to the first data output.

7. The communication system of claim 6, wherein the master includes a shift register data output connected to the shift register data input.

8. The communication system of claim 7, wherein the master activates the bus-compatible sensor element in order to output an activation pulse as the activation signal at the shift register data output, and to output the second clock signal at the second clock output until the activation pulse is present at the slave select connection of the sensor element.

9. The communication system of claim 7, further comprising a first to nth bus-compatible sensor element, where n is a natural number.

10. The communication system of claim 9, wherein the first data inputs of the sensor elements are connected to the first master data output via a parallel data line.

11. The communication system of claim 10, wherein the first data outputs of the sensor elements are connected to the master data input via a parallel data return line.

12. The communication system of claim 11, wherein the shift register data output of the master is connected to the shift register data input of the first sensor element of the sensor elements.

13. The communication system of claim 12, wherein the shift register output of the first sensor element and each further sensor element with the exception of the nth sensor element are connected to the shift register data input of a next sensor element, forming a serial path through the sensor elements for the activation signal.

14. The communication system of claim 13, wherein a reset input of each of the first to nth sensor elements are connected via a parallel reset line to a reset output of the master.

15. The communication system of claim 13, wherein a return line connects the shift register output of the nth sensor element to an activation pulse detection input of the master.

16. The communication system of claim 5, wherein the master has a reset output connected to a reset input of the bus-compatible sensor element for resetting the shift register output.

17. A magnetic field sensor unit, comprising:
a plurality of bus-compatible sensor elements each including a converter generating a digital measurement signal, a first data input receiving an input data, a first data output for outputting an output data, a first clock input receiving a first clock signal, a slave select connection receiving an activation signal, and a 1-bit shift register, the 1-bit shift register includes a shift register data input, a shift register output, and a second clock input receiving a second clock signal separate and independent from the first clock signal, the shift register output is connected to the slave select connection to activate the sensor element in response to the activation signal present at the shift register data input; and
a control unit communicating with the plurality of bus-compatible sensor elements according to a serial peripheral interface protocol, the sensor elements connected in series and forming a plurality of slaves and the control unit forming a master.

18. The magnetic field sensor unit of claim 17, wherein the control unit and the plurality of bus-compatible sensor elements are disposed on a common circuit carrier.

19. A magnetoelectric displacement sensor, comprising:
a magnetic field source; and
a magnetic field sensor unit including a plurality of bus-compatible sensor elements each having a converter generating a digital measurement signal, a first data input receiving an input data, a first data output for outputting an output data, a first clock input receiving a first clock signal, a slave select connection receiving an activation signal, a 1-bit shift register, the 1-bit shift register includes a shift register data input, a shift register output, and a second clock input receiving a second clock signal separate and independent from the first clock signal, the shift register output is connected to the slave select connection to activate the sensor element in response to the activation signal present at the shift register data input, and a magnetic field probe detecting a magnetic flux density of a magnetic field of the magnetic field source and generating an analog electrical output signal as a function of the magnetic field, the magnetic field source is movable with respect to the magnetic field sensor unit, depending on the position of the magnetic field source the magnetic field probe of at least one of the bus-compatible sensor elements detects the magnetic field of the magnetic field source.

20. A method for exchanging data, comprising:
providing a communication system including a master and a first to nth bus-compatible sensor element, with n being a natural number, each of the bus-compatible sensor elements has a converter generating a digital measurement signal, a first data input receiving an input data from the master, a first data output for outputting an output data, a first clock input receiving a first clock signal from the master, a slave select connection receiving an activation signal, and a 1-bit shift register, the 1-bit shift register includes a shift register data input, a shift register output, and a second clock input, the shift register output is connected to the slave select connection to activate the sensor element in response to the activation signal present at the shift register data input;
transmitting data to the sensor elements, the first data inputs of the sensor elements connected to a first master data output of the master by a parallel data line;
receiving data from the sensor elements, the first data outputs of the sensor elements connected to a master data input of the master by a parallel data return line;
activating one of the sensor elements by outputting an activation pulse from a shift register data output of the master, the shift register data output connected to the shift register data input of the first sensor element, and the shift register output of the first sensor element and each additional sensor element with the exception of the nth sensor element connected to the shift register data input of the next sensor element, forming a serial path through the sensor elements; and
outputting a second clock signal at a second clock output of the master separate and independent from the first clock signal and connected to the second clock input until the activation pulse is present at the slave select connection of the one sensor element.

* * * * *